(12) United States Patent
Kao et al.

(10) Patent No.: US 8,835,206 B2
(45) Date of Patent: Sep. 16, 2014

(54) PIXEL STRUCTURE, ARRAY SUBSTRATE AND METHOD OF FABRICATING THE SAME

(75) Inventors: Chin-Tzu Kao, Changhua County (TW); Jin-Chuan Kuo, Taoyuan County (TW); Ya-Ju Lu, New Taipei (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 45 days.

(21) Appl. No.: 13/537,025

(22) Filed: Jun. 28, 2012

(65) Prior Publication Data
US 2013/0112977 A1    May 9, 2013

(30) Foreign Application Priority Data
Nov. 7, 2011   (TW) .............................. 100140589 A

(51) Int. Cl.
H01L 29/10    (2006.01)
G02F 1/136    (2006.01)
H01L 29/45    (2006.01)
H01L 27/12    (2006.01)

(52) U.S. Cl.
CPC ............ H01L 27/124 (2013.01); H01L 29/458 (2013.01)
USPC ................. 438/38; 438/29; 438/637; 257/59; 257/72; 257/E33.012; 257/E33.064; 349/42; 349/43

(58) Field of Classification Search
CPC ............................ H01L 27/124; H01L 29/458
USPC ......... 257/59, 72, E33.012, E33.064; 438/29, 438/38, 648, 637; 349/42, 43, 46
See application file for complete search history.

(56) References Cited

U.S. PATENT DOCUMENTS

| | | | |
|---|---|---|---|
| 2004/0173797 A1* | 9/2004 | Kim | 257/59 |
| 2006/0022203 A1* | 2/2006 | Misaki et al. | 257/72 |
| 2007/0085118 A1* | 4/2007 | Yasuda | 257/291 |
| 2008/0203390 A1 | 8/2008 | Kim | |
| 2009/0032819 A1 | 2/2009 | Lim | |

* cited by examiner

Primary Examiner — Jose R Diaz
(74) Attorney, Agent, or Firm — Winston Hsu; Scott Margo

(57) ABSTRACT

The present invention provides a pixel structure including a substrate, a first metal pattern layer, an insulating layer, a second metal pattern layer, a passivation layer, and a conductive protection layer. The substrate has at least one pixel region. The first patterned metal layer is disposed on the substrate, and has a top surface. The insulating layer is disposed on the first patterned metal layer and the substrate, and is in contact with the top surface of the first patterned metal layer. The second patterned metal layer is disposed on the insulating layer in the pixel region, and includes a source and a drain. The passivation layer is disposed on the second patterned metal layer and the insulating layer. A top surface of the source is in contact with the passivation layer, and the conductive protection layer is disposed on the drain.

7 Claims, 8 Drawing Sheets

PIXEL STRUCTURE, ARRAY SUBSTRATE AND METHOD OF FABRICATING THE SAME

BACKGROUND OF THE INVENTION

1. Field of the Invention

The present invention relates to a pixel structure, an array substrate and a method of fabricating the same, and more particularly, to a pixel structure having a conductive protection layer for protecting a metal layer, an array substrate and a method of fabricating the same.

2. Description of the Prior Art

The liquid crystal display (LCD) panel is characterized by light weight, low power consumption, and low radiation, and is widely applied in portable electronic products such as notebook computers, personal digital assistant (PDAs), and video camera. the LCD panel in the prior art is composed of an array substrate, a color filter substrate, and a liquid crystal layer, and rotation angles of liquid crystal molecules in the liquid crystal layer could be adjusted through controlling a voltage applied between a pixel electrode of the array substrate and a common electrode of the color filter substrate so as to display a required frame.

Generally, the array substrate in the prior art includes a plurality of data lines, a plurality of scan lines, a plurality of common lines, and a plurality of thin-film transistors (TFTs). The scan lines, the common lines and gates of the TFTs are constituted by a first metal layer, and the data lines and sources and drains are constituted by a second metal layer. In addition, each TFT has a semiconductor layer serving as its channel. However, the first metal layer and the second metal layer are generally made of aluminum, so that when aluminum is in contact with silicon of the semiconductor layer, aluminum is easily diffused into the semiconductor layer, and the operation of each TFT is affected by the diffusion. For this reason, in order to avoid the source and the drain composed of aluminum being diffused into silicon, a molybdenum (Mo) metal layer is disposed between the semiconductor layer and the second metal layer in the array substrate of the prior art. Besides, another Mo metal layer is disposed on the first metal layer, and another Mo metal layer is disposed on the second metal layer in the array substrate of the prior art, so that the first metal layer and the second metal layer composed of aluminum could be avoided being oxidized or corroded.

However, in the method of fabricating the array substrate in the prior art, the first metal layer and the Mo metal layer disposed thereon are formed in the same etching process, and the second metal layer, the Mo metal layer disposed thereon and the Mo metal layer disposed there under are formed in the same etching process. In addition, the etching rate of aluminum and the etching rate of the Mo are different, so that the formed first metal layer, the formed second metal layer and the formed Mo metal layer have overhangs, and a problem of the insulating layer and the passivation layer formed in the following step having bad coverage on the overhangs is generated.

SUMMARY OF THE INVENTION

It is therefore an objective of the present invention to provide a pixel structure, an array substrate and a method of fabricating the same to save manufacturing cost and solve the above-mentioned problem.

According to a preferred embodiment of the present invention, a pixel structure is provided. The pixel structure includes a substrate, a first patterned metal layer, an insulating layer, a patterned semiconductor layer, a first conductive protection layer, a second patterned metal layer, a passivation layer, a second conductive protection layer, and a patterned transparent conductive layer. The substrate has at least one pixel region. The first patterned metal layer is disposed on the substrate, and the first patterned metal layer has a top surface. The insulating layer is disposed on the first patterned metal layer and the substrate, and the insulating layer is in contact with the top surface of the first patterned metal layer. The patterned semiconductor layer is disposed on the insulating layer in the pixel region. The first conductive protection layer is disposed on the patterned semiconductor layer. The second patterned metal layer is disposed on the first conductive protection layer, and the second patterned metal layer includes a source and a drain. The passivation layer is disposed on the second patterned metal layer and the insulating layer, wherein a top surface of the source is directly in contact with the passivation layer. The second conductive protection layer is disposed on the drain. The patterned transparent conductive layer is disposed on the passivation layer and the second conductive protection layer.

According to a preferred embodiment of the present invention, an array substrate is provided. The array substrate includes a substrate, a first patterned metal layer, an insulating layer, a patterned semiconductor layer, a first conductive protection layer, a second patterned metal layer, a passivation layer, a second conductive protection layer, and a patterned transparent conductive layer. The substrate has at least one pixel region and at least pad region. The first patterned metal layer is disposed on the substrate, and the first patterned metal layer includes a gate disposed in the pixel region and a pad disposed in the pad region. The insulating layer is disposed on the first patterned metal layer and the substrate, wherein the insulating layer is in contact with a top surface of the gate. The patterned semiconductor layer is disposed on the insulating layer in the pixel region. The first conductive protection layer is disposed on the patterned semiconductor layer. The second patterned metal layer is disposed on the first conductive protection layer, and the second patterned metal layer includes a source and a drain. The passivation layer is disposed on the second patterned metal layer. The second conductive protection layer is disposed on the pad, and the second conductive protection layer is directly in contact with a top surface of the pad and a top surface of the drain. The patterned transparent conductive layer is disposed on the passivation layer and the second conductive protection layer.

According to an embodiment of the present invention, a method of fabricating an array substrate is provided. First, a substrate is provided, and the substrate has at least one pixel region and at least one pad region. Then, a first patterned metal layer is formed on the substrate, and the first patterned metal layer includes a gate disposed in the pixel region and a pad disposed in the pad region. Thereafter, an insulating layer is formed on the first patterned metal layer. Next, a patterned semiconductor layer is formed on the insulating layer in the pixel region. Subsequently, a second patterned metal layer and a first conductive protection layer are formed on the patterned semiconductor layer, and the second patterned metal layer includes a source and a drain. Next, a passivation layer is formed on the second patterned metal layer and the insulating layer. Then, a first through hole is formed in the passivation layer. Next, a second conductive protection layer is formed in the first through hole. Then, a patterned transparent conductive layer is formed.

The method of fabricating the array substrate in the present invention doesn't form the first patterned metal layer and the second patterned metal layer together with the second conductive protection layer, and only forms the second conductive protection layer on the exposed first patterned metal layer and the exposed second patterned metal layer after forming the first through hole exposing the second patterned metal layer and the second through hole exposing the first patterned metal layer so as to avoid the drain and the pad being oxidized or corroded. Accordingly, as compared with the method of the prior art that forms the Mo metal layers respectively on first metal layer and the second metal layer, the method of the present invention could reduce a deposition process, and save manufacturing cost. Furthermore, the method of the present invention separately forms the first patterned metal layer and the second patterned metal layer and the second conductive protection layer, so that the problem of the first patterned metal layer, the second patterned metal layer and the second conductive protection layer having bad coverage due to the etching rate of aluminum being different from the etching rate of Mo could be solved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
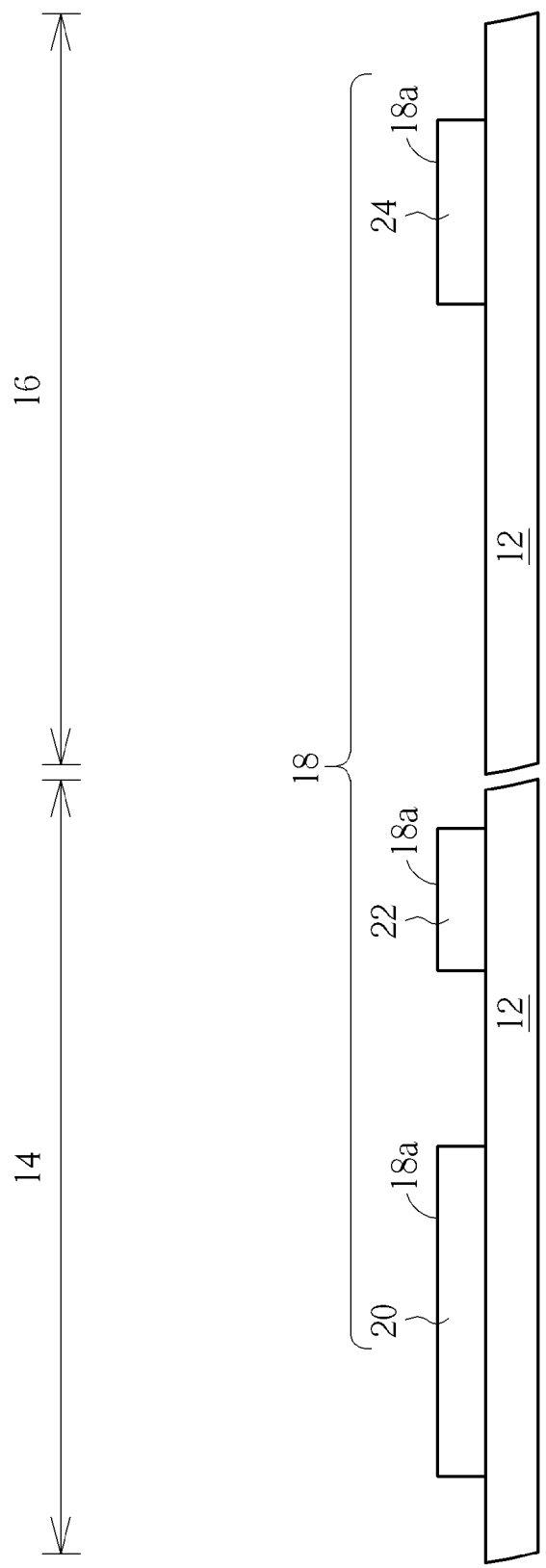
FIG. 1 through FIG. 8 are schematic diagrams illustrating a method of fabricating an array substrate according to a preferred embodiment of the present invention.
Figure 6:
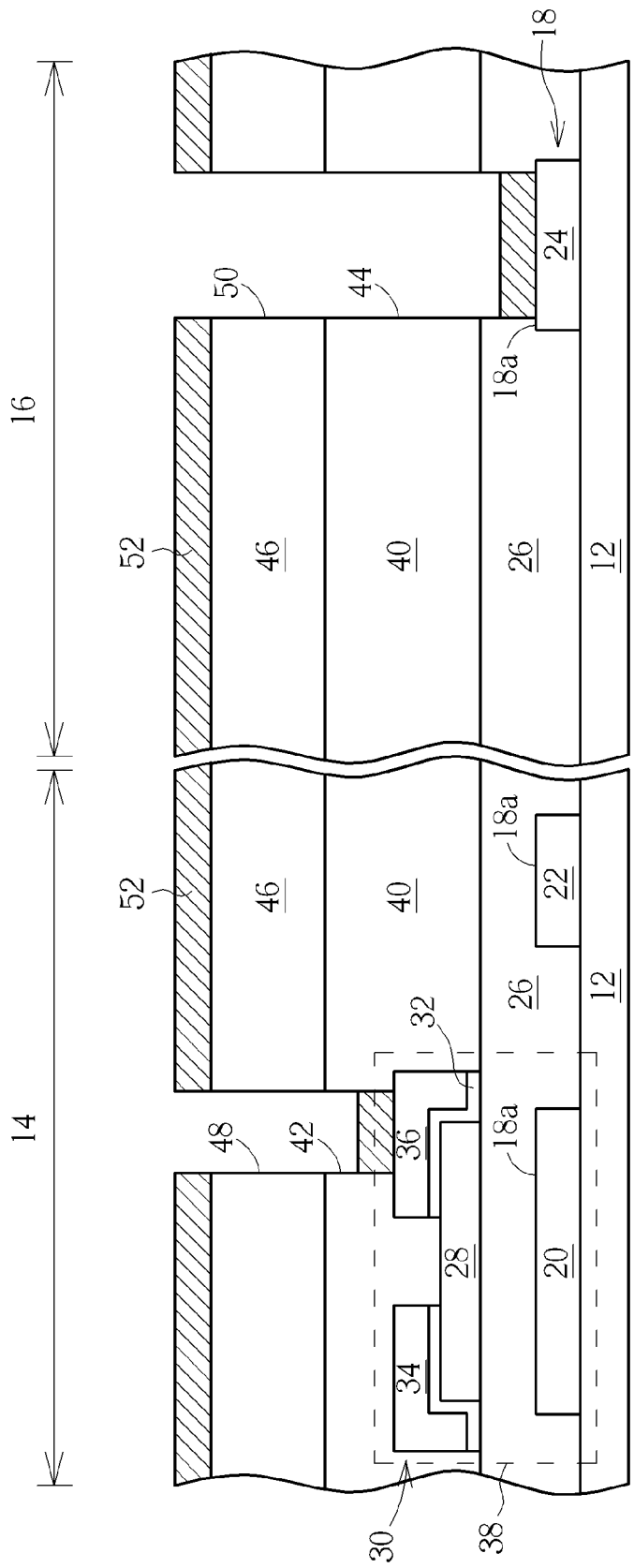
Figure 7:
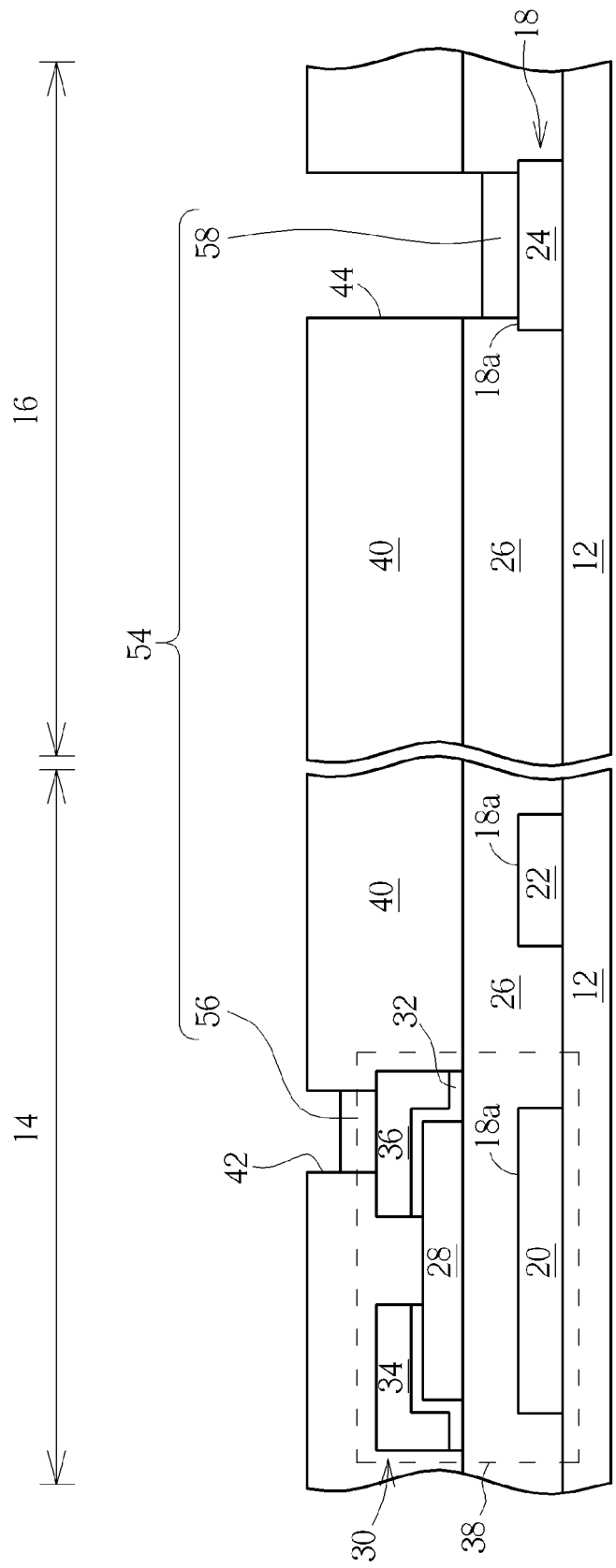
Figure 8:
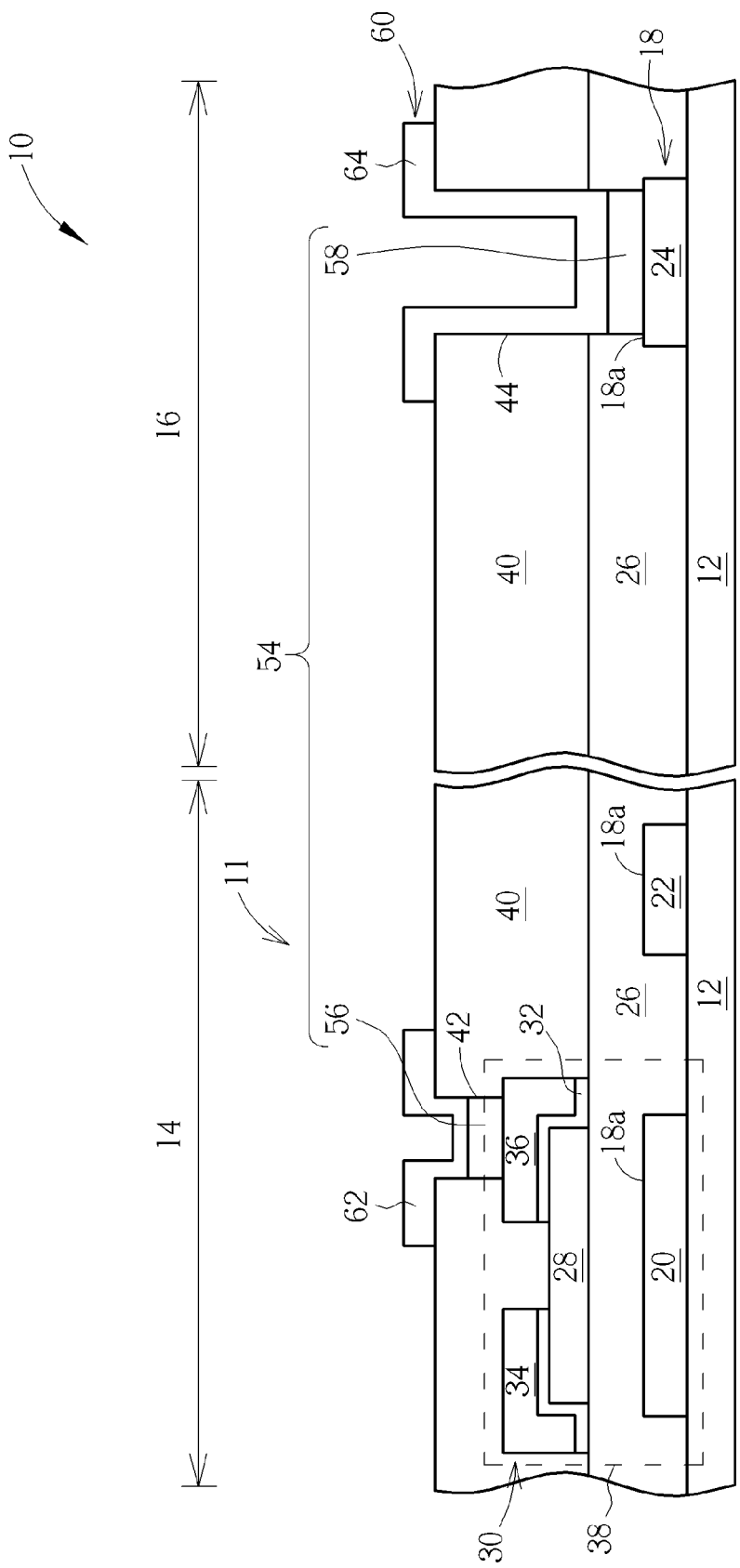

Refer to FIG. 1 through FIG. 8, which are schematic diagrams illustrating a method of fabricating an array substrate according to a preferred embodiment of the present invention, and FIG. 8 is a schematic diagram illustrating a cross-sectional view of the array substrate according to the preferred embodiment of the present invention. The following description in this embodiment takes a pixel structure of the array substrate in a single pixel region and the array substrate in a single pad region as an example. The array substrate of the present invention is not limited to only have one pixel region and one pad region, and could have a plurality of pixel regions and a plurality of pad regions. Furthermore, the number of devices formed in the pixel region in the present invention is not limited to be one. As shown in FIG. 1, a substrate 12 is provided first, and the substrate 12 has at least one pixel region 14 and at least one pad region 16. Next, a first metal layer is formed on the substrate 12, and a photolithographic and etching process is performed to pattern the first metal layer to form a first patterned metal layer 18. The first patterned metal layer includes a gate 20, a common line 22, and a pad 24, and the first patterned metal layer 18 has a top surface 18a. The gate 20 and the common line 22 are disposed in the pixel region 14, and the pad 24 is disposed in the pad region 16. In this embodiment, the substrate 12 could be a transparent substrate, such as glass substrate or plastic substrate, but the present invention is not limited herein. In addition, a material of forming the first metal layer could be aluminum. The present invention is not limited herein, and the material of forming the first metal layer in present invention could be other metal materials. Furthermore, the step of patterning the first metal layer in this embodiment doesn't pattern other metal materials, so that the overhang could be avoided, and the problem of the insulating layer formed in the following step having bad coverage could be solved.

Figure 2:
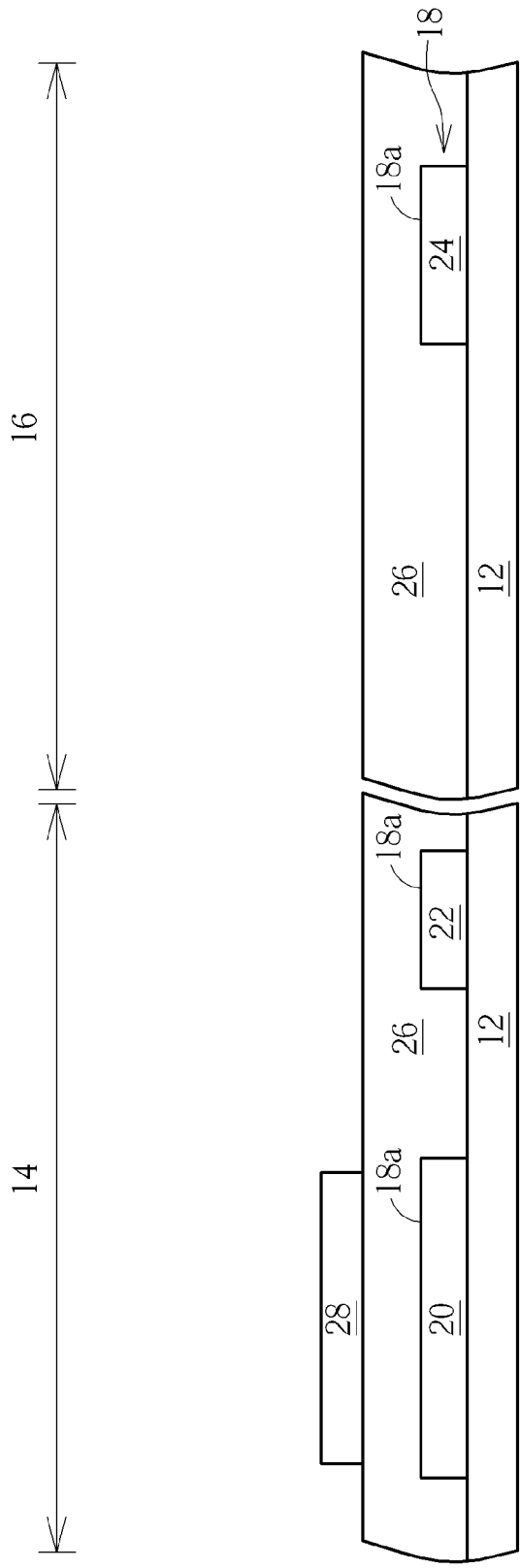

As shown in FIG. 2, an insulating layer 26 is then formed on the first patterned metal layer 18 and the substrate 12, so that the insulating layer 26 is in contact with the top surface 18a of the first patterned metal layer 18. Thereafter, a deposition process and another photolithographic and etching process are performed to form a patterned semiconductor layer 28 on the insulating layer 26 in the pixel region 14, and the patterned semiconductor layer 28 is disposed right on the gate 20. In this embodiment, the insulating layer 26 covers the gate 20 and the common line 22, and the top surfaces 18a of the gate 20, the common line 22 and the pad 24 are directly in contact with the insulating layer 26. The material of forming the insulating layer 26 could be an insulating material such as silicon nitride, but the present invention is not limited herein. In addition, the patterned semiconductor layer 28 could include an amorphous silicon layer and a p-doped or n-doped amorphous silicon layer, and the step of forming the patterned semiconductor layer 28 could form an amorphous silicon layer on the insulating layer 26 first, and then, an ion-implantation process is performed to implant p-type or n-type ions into the amorphous silicon layer to form the p-doped or n-doped amorphous silicon layer. The present invention is not limited to the above-mentioned method.

Figure 3:
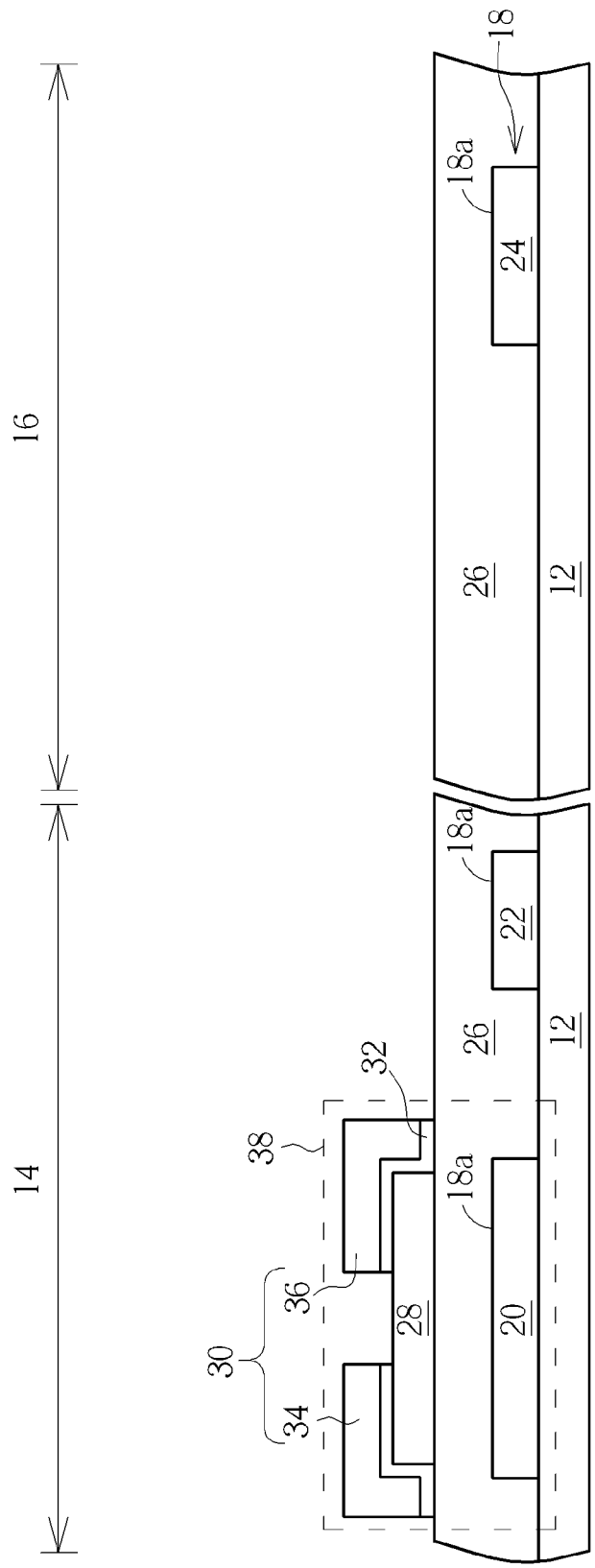

As shown in FIG. 3, another deposition process is then performed to form a first conductive protection material layer (not shown in figures) on the patterned semiconductor layer 28 and the insulating layer 26. Next, a second metal layer (not shown in figures) is formed on the first conductive protection material layer. Subsequently, another photolithographic and etching process is performed to pattern the second metal layer and the first conductive protection material layer to form a second patterned metal layer 30 and a first conductive protection layer 32 on the patterned semiconductor layer 28 and the insulating layer 26 in the pixel region 14. The second patterned metal layer 30 includes a source 34 and a drain 36, and the source and the drain have a gap disposed between them and corresponding to the gate 20. Accordingly, the source 34 and the drain 36 are respectively disposed right on two sides of the gate 20. Since the first conductive protection layer 32 and the second patterned metal layer 30 are formed in a same etching process, the first conductive protection layer 32 also has two portions respectively corresponding to the source 34 and the drain 36, and the two portions also have the same pattern as the source 34 and the drain 36 respectively. The present invention is not limited herein. In this embodiment, a material of forming the second metal layer could be aluminum, but is not limited herein. A material of forming the first conductive protection material layer could be a conductive material, such as chromium, an alloy of Mo and niobium or an alloy of Mo and tantalum, so that the formed first conductive protection layer 32 could be used to avoid the second patterned metal layer 30 composed of aluminum being diffused into the patterned semiconductor layer 28 composed of silicon. In addition, the gate 20, the insulating layer 26, the first conductive protection layer 32, the source 34 and the drain 36 could constitute a thin-film transistor (TFT) 38 used to switch a pixel corresponding to the pixel region 14.

Figure 4:
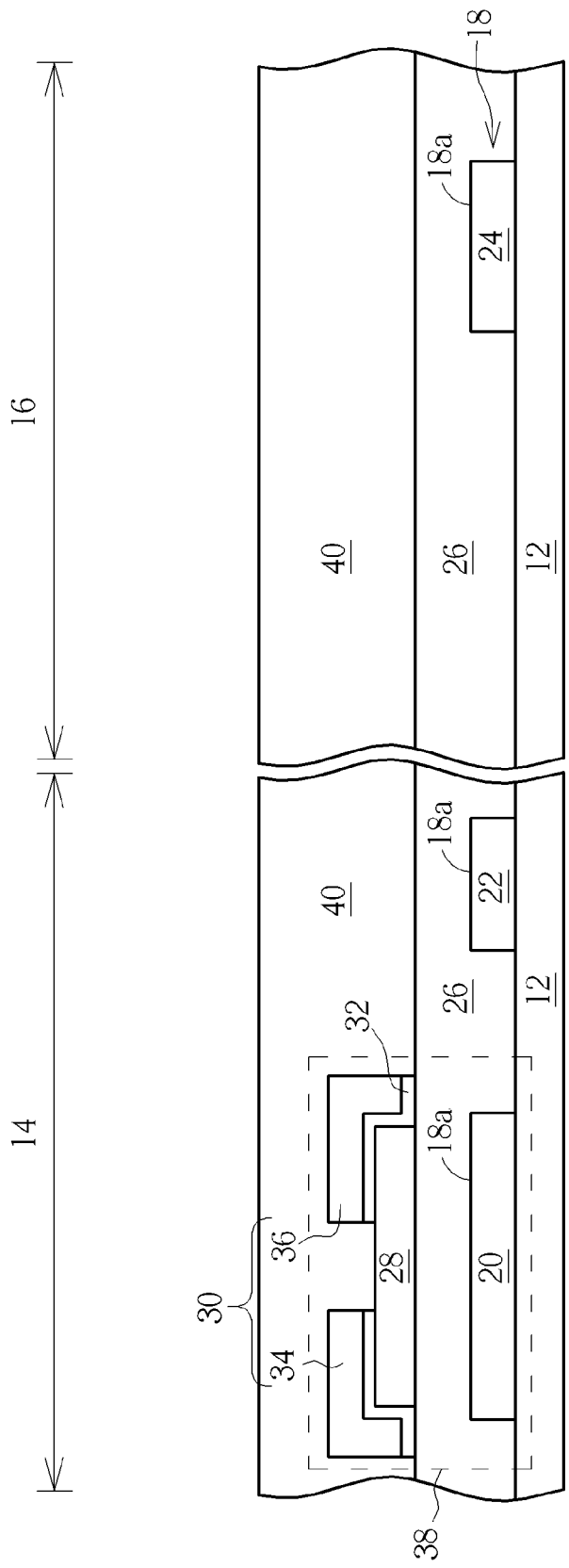

As shown in FIG. 4, a passivation layer 40 is formed on the second patterned metal layer 30, the patterned semiconductor layer 28, and the insulating layer 26 to protect the TFT 38. In this embodiment, a material of forming the passivation layer 40 could be an insulating material, such as silicon nitride, but is not limited thereto. In addition, the passivation layer 40 in this embodiment covers the source 34, and a top surface of the source 34 is directly in contact with the passivation layer 40.

Figure 5:
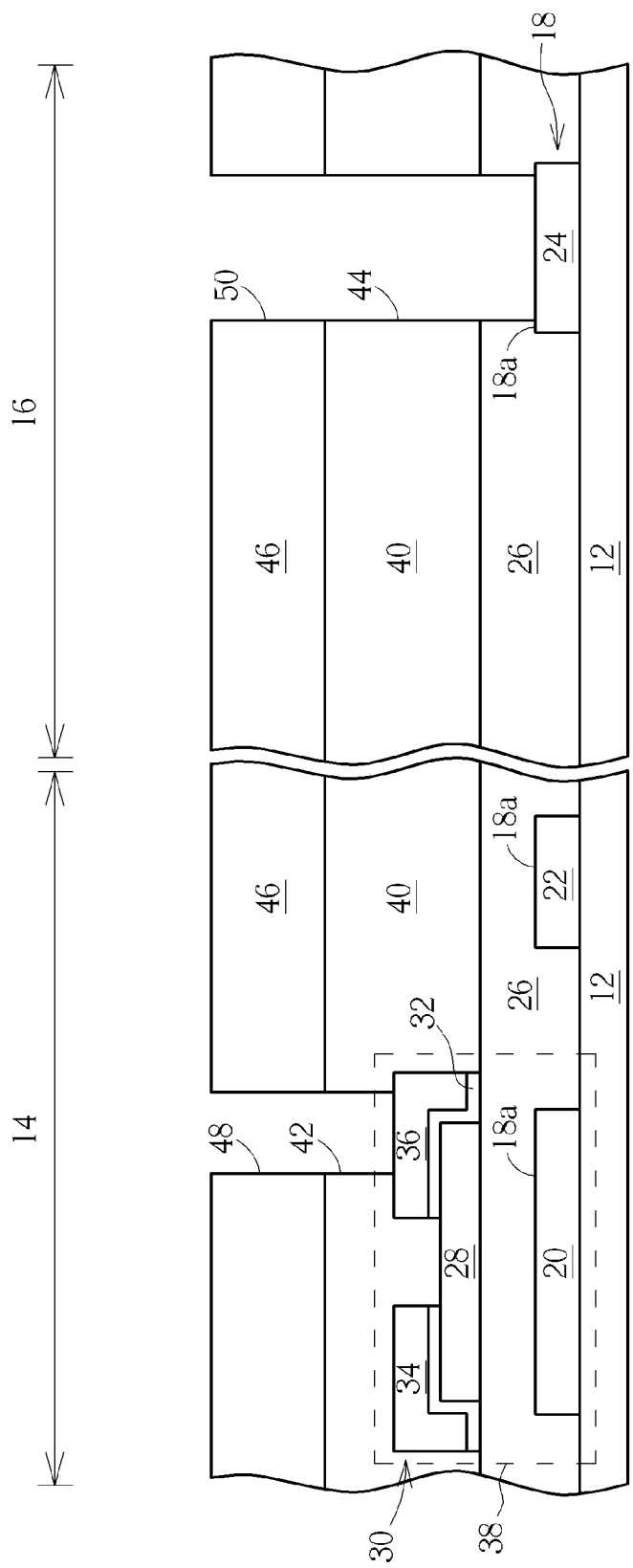

As shown in FIG. 5, after that, a first through hole 42 is formed in the passivation layer 40 of the pixel region 14 to expose the drain 36, and a second through hole 44 is formed in the passivation layer 40 and the insulating layer 26 of the pad region 16 to expose the pad 24. In the step of forming the first through hole 42 and the second through hole 44 of this embodiment, a patterned photoresist layer 46 could be formed on the passivation layer 40 first. The patterned photoresist layer 46 has a third through hole 48 disposed in the pixel region 14 and a fourth through hole 50 disposed in the pad region 16. The third through hole 48 exposes the passivation layer 40 disposed right on the drain 36, and the fourth through hole 50 exposes the passivation layer 40 disposed right on the pad 24. Then, the patterned photoresist layer 46 serves as a mask, and an etching process is performed to remove the passivation layer 40 exposed by the third through hole 48 to form the first through hole 42 and to remove the passivation layer 40 exposed by the fourth through hole 50 and the insulating layer 26 disposed under the passivation layer 40 exposed by the fourth through hole 50 to form the second through hole 44. The etching process of this embodiment has a high etching selectivity for etching silicon nitride relative to silicon, so that the etching process could continuously etch the passivation layer 40 and the insulating layer 26 in the pad region 16 to form the second through hole 44 after forming the first through hole 42.

As shown in FIG. 6, another deposition process is then performed to form a second conductive protection material layer 52 on the patterned photoresist layer 46, the drain 36 exposed by the first through hole 42 and the pad 24 exposed by the second through hole 44. In this embodiment, the second conductive protection material layer 52 covers the exposed drain 36 and the exposed pad 24 to protect the drain 36 and the pad 24 from being oxidized and corroded. A material of forming the second conductive protection material layer could be a conductive material, such as chromium, an alloy of Mo and niobium or an alloy of Mo and tantalum, but is not limited thereto.

As shown in FIG. 7, the patterned photoresist layer 46 and the second conductive protection material layer 52 disposed on the patterned photoresist layer 46 are then removed to form a second conductive protection layer 54 on the drain 36 in the first through hole 42 and the pad 24 in the second through hole 44. The second conductive protection layer 54 includes a first portion 56 and a second portion 58. The first portion 56 is disposed in the first through hole 24, and is in contact with the drain 36. A width of the first portion 56 is the same as a width of the first through hole 24. Furthermore, the second portion 58 is disposed in the second through hole 44, and is in contact with the pad 24. A width of the second portion 58 is the same as a width of the second through hole 44. In this embodiment, the step of removing the patterned photoresist layer 46 and the second conductive protection material layer 52 disposed on the patterned photoresist layer 46 utilizes a lift off process, but is not limited herein.

As shown in FIG. 8, a transparent conductive layer is then formed on the passivation layer 40 and the second conductive protection layer 54. Thereafter, the transparent conductive layer is patterned to form a patterned transparent conductive layer 60. The patterned transparent conductive layer 60 includes a pixel electrode 62 and a connecting line 64, and the pixel electrode 62 is electrically insulated from the connecting line 64. Thus, the array substrate 10 of this embodiment is completed. The array substrate 10 in the pixel region 14 is a pixel structure 11. In this embodiment, the pixel electrode 62 is disposed on the passivation layer 40 in the pixel region 14, and extends to be in contact with the first portion 56 of the second conductive protection layer 54 through the first through hole 42, so that the pixel electrode 62 could be electrically connected to the drain 36. The connecting line 64 is disposed on the passivation layer 40 in the pad region 16, and extends to be in contact with the second portion 58 of the second conductive protection layer 54 through the second through hole 44, so that the connecting line 64 could be electrically connected to the pad 24, and the pad 24 could be electrically connected to the outside. Furthermore, a material of forming the transparent conductive layer could be a transparent conductive material, such as indium-tin oxide or indium-zinc oxide, but is not limited thereto.

In summary, the method of fabricating the array substrate in the present invention doesn't form the first patterned metal layer and the second patterned metal layer together with the second conductive protection layer, and only forms the second conductive protection layer on the exposed first patterned metal layer and the exposed second patterned metal layer after forming the first through hole exposing the second patterned metal layer and the second through hole exposing the first patterned metal layer so as to avoid the drain and the pad being oxidized or corroded. Accordingly, as compared with the method of the prior art that forms the Mo metal layers respectively on first metal layer and the second metal layer, the method of the present invention could reduce a deposition process, and save manufacturing cost. Furthermore, the method of the present invention separately forms the first patterned metal layer and the second patterned metal layer and the second conductive protection layer, so that the problem of the first patterned metal layer, the second patterned metal layer and the second conductive protection layer having bad coverage due to the etching rate of aluminum being different from the etching rate of Mo could be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating an array substrate, comprising:
providing a substrate, and the substrate having at least one pixel region and at least one pad region;
forming a first patterned metal layer on the substrate, and the first patterned metal layer comprising a gate disposed in the pixel region and a pad disposed in the pad region;
forming an insulating layer on the first patterned metal layer;
forming a patterned semiconductor layer on the insulating layer in the pixel region;
forming a second patterned metal layer and a first conductive protection layer on the patterned semiconductor layer, and the second patterned metal layer comprising a source and a drain;
forming a passivation layer on the second patterned metal layer and the insulating layer;
forming a first through hole in the passivation layer, the first through hole exposes the drain, and the step of forming the first through hole comprising:
 forming a patterned photoresist layer on the passivation layer, and the patterned photoresist layer having a third through hole disposed in the pixel region and exposing the passivation layer; and
 removing the passivation layer exposed by the third through hole to form the first through hole;
forming a second conductive protection layer in the first through hole, and the second conductive protection layer comprising a first portion, the step of forming the second conductive protection layer comprising:

forming a conductive protection material layer on the drain exposed by the first through hole and the patterned photoresist layer; and removing the patterned photoresist layer and the conductive protection material layer disposed thereon to form the second conductive protection layer on the drain in the first through hole, wherein the first portion is only disposed in the first through hole, and the first portion is in contact with the drain; and forming a patterned transparent conductive layer on the passivation layer.

2. The method of fabricating the array substrate according to claim 1, wherein the step of removing the patterned photoresist layer and the conductive protection material layer disposed thereon utilizes a lift off process.

3. The method of fabricating the array substrate according to claim 1, the step of forming the first through hole comprises forming a second through hole in the passivation layer and the insulating layer in the pad region to expose the pad.

4. The method of fabricating the array substrate according to claim 3, wherein the step of forming the second through hole comprises:

forming a patterned photoresist layer on the passivation layer, and the patterned photoresist layer having a fourth through hole disposed in the pad region and exposing the passivation layer; and removing the passivation layer exposed by the fourth through hole and the insulating layer disposed under the passivation layer exposed by the fourth through hole to form the second through hole.

5. The method of fabricating the array substrate according to claim 4, wherein the step of forming the second conductive protection layer comprises:

forming a conductive protection material layer on the pad exposed by the second through hole and the patterned photoresist layer; and removing the patterned photoresist layer and the conductive protection material layer disposed thereon to form the second conductive protection layer on the pad in the second through hole.

6. The method of fabricating the array substrate according to claim 1, wherein a material of the first conductive protection layer is chromium, an alloy of Mo and niobium or an alloy of Mo and tantalum.

7. The method of fabricating the array substrate according to claim 1, wherein a material of the second conductive protection layer is chromium, an alloy of Mo and niobium or an alloy of Mo and tantalum.

* * * * *